US010239225B1

(12) United States Patent
Weinschenk

(10) Patent No.: US 10,239,225 B1
(45) Date of Patent: Mar. 26, 2019

(54) AUTOMATED SYSTEM AND METHOD TO ENHANCE SAFETY AND STRENGTH OF WOOD TRUSS STRUCTURES

(71) Applicant: Steven R. Weinschenk, Rochester, MN (US)

(72) Inventor: Steven R. Weinschenk, Rochester, MN (US)

(73) Assignee: Wein Holding LLC, Rochester, MN (US)

( * ) Notice: Subject to any disclaimer, the term of this patent is extended or adjusted under 35 U.S.C. 154(b) by 0 days.

(21) Appl. No.: 15/408,369

(22) Filed: Jan. 17, 2017

Related U.S. Application Data

(60) Provisional application No. 62/388,048, filed on Jan. 14, 2016.

(51) Int. Cl.
*B07C 5/14* (2006.01)
*B27B 31/06* (2006.01)
(Continued)

(52) U.S. Cl.
CPC ............. *B27B 31/06* (2013.01); *B07C 5/14* (2013.01); *B07C 5/342* (2013.01); *G06F 17/5004* (2013.01)

(58) Field of Classification Search
CPC ......... B07C 5/342; B27B 31/00; B27B 31/06; B27B 31/08
(Continued)

(56) References Cited

U.S. PATENT DOCUMENTS 1,804,764 A 5/1931 Grant
1,916,567 A 7/1933 Grant
(Continued)

FOREIGN PATENT DOCUMENTS

CN 202899636 U 4/2013

OTHER PUBLICATIONS

Weinmann Holzbausystemtechnik GMBH, "WHP 100 Robotic Material Handling Portal", "Structural Building Components Magazine, downloaded from: http://www.sbcmag.info/sites/default/files/Archive/2008/sep/0809_cc.pdf", Sep./Oct. 2008.
(Continued)

*Primary Examiner* — Terrell H Matthews
(74) *Attorney, Agent, or Firm* — Charles A. Lemaire; Jonathan M. Rixen; Lemaire Patent Law Firm, P.L.L.C.

(57) ABSTRACT

A system that includes a computer processor having a plurality of input data devices, a plurality of output data devices, and a plurality of sensors; and a mechanical assembly integrated with the computer processor to reposition a piece of wood lumber based on software code executing in the computer processor. In some embodiments, the system performs a method that includes eliciting and receiving into the computer processor data parameters from a first human user; obtaining incoming data points about the lumber from the plurality of sensors; processing and storing the data parameters; comparing the incoming data points to the data parameters to obtain comparison results; and, based on the comparison results, (1) rejecting the lumber to a preprogrammed position, (2) feeding the lumber into a saw assembly as positioned, or (3) repositioning the lumber to a more optimal position prior to feeding the lumber to the saw assembly.

20 Claims, 4 Drawing Sheets

(51) Int. Cl.
*G06F 17/50* (2006.01)
*B07C 5/342* (2006.01)

(58) Field of Classification Search
USPC .................................................. 209/517, 518
See application file for complete search history.

(56) References Cited

U.S. PATENT DOCUMENTS

| | | | |
|---|---|---|---|
| 2,510,471 A | 6/1950 | Horstkotte | |
| 2,806,492 A | 9/1957 | Becker | |
| 3,124,181 A | 3/1964 | Clemans | |
| 3,815,738 A * | 6/1974 | Sweet | B07C 5/10 209/518 |
| 4,139,035 A * | 2/1979 | Bystedt | B27B 31/06 144/215.2 |
| 4,196,648 A | 4/1980 | Jones et al. | |
| 4,867,213 A * | 9/1989 | Bolton | B27B 31/06 144/357 |
| 4,909,112 A | 3/1990 | Rosenthal | |
| 4,951,215 A | 8/1990 | Scherer | |
| 4,992,949 A * | 2/1991 | Arden | B07C 5/3422 209/518 |
| 5,335,790 A * | 8/1994 | Geiger | B07C 5/14 144/340 |
| 5,564,573 A * | 10/1996 | Palm | B07C 5/14 209/518 |
| 6,170,163 B1 | 1/2001 | Bordignon et al. | |
| 6,923,614 B2 | 8/2005 | Aylsworth | |
| 7,463,368 B2 | 12/2008 | Morden et al. | |
| 7,621,053 B2 | 11/2009 | Bianchin | |
| 7,801,637 B2 * | 9/2010 | Sander | B23D 59/008 144/245.5 |
| 7,950,316 B2 | 5/2011 | Koskovich | |
| 8,010,216 B2 | 8/2011 | Roise | |
| 8,079,579 B2 | 12/2011 | Fredrickson et al. | |
| 8,782,878 B2 | 7/2014 | Morden et al. | |
| 8,919,001 B2 | 12/2014 | Le Mer et al. | |
| 8,960,244 B1 | 2/2015 | Aylsworth et al. | |
| 9,316,506 B2 | 4/2016 | Aspen | |
| 9,369,632 B2 | 6/2016 | Short | |
| 10,080,003 B2 | 9/2018 | Tone | |
| 2005/0013472 A1 * | 1/2005 | Gauthier | G05B 19/4183 382/141 |
| 2005/0027389 A1 | 2/2005 | Hadaway et al. | |
| 2008/0223768 A1 * | 9/2008 | Ahrens | B07C 5/14 209/518 |
| 2008/0297740 A1 | 12/2008 | Huynh et al. | |
| 2010/0201702 A1 | 8/2010 | Franik et al. | |
| 2014/0341444 A1 * | 11/2014 | Hou | G06F 21/32 382/118 |
| 2015/0054792 A1 | 2/2015 | Kuki | |
| 2017/0050334 A1 | 2/2017 | Aylsworth | |
| 2017/0057113 A1 * | 3/2017 | Aylsworth | B27B 31/00 |
| 2017/0217022 A1 | 8/2017 | Aylsworth | |
| 2017/0274489 A1 * | 9/2017 | Baratta | B23D 59/001 |
| 2017/0305029 A1 | 10/2017 | Aylsworth | |
| 2018/0001508 A1 | 1/2018 | Aylsworth | |

OTHER PUBLICATIONS

Weinmann Holzbausystemtechnik GMBH, "Carpentry machines WBS and WBZ", "Downloaded from internet: http://www.homag.com/fileadmin/product/houseconstruction/brochures/weinmann-carpentry-machines-WBS-and-WBZ-english.pdf", May 2016, Publisher: Publication at least as early May 2016.

Mereen-Johnson, LLC, "Mereen-Johnson Rip Optimizing Systems (internet web page)", "Downloaded from internet page: http://www.mereen-johnson.com/content/mereen-johnson-gang-rip-saw-optimizing-systems", possibly Sep. 2014, pp. 13.

Mereen-Johnson, LLC, "Rip Navigator Tracker Rip Optimizing System", "Downloaded from internet page: http://www.mereen-johnson.com/sites/default/files/2017-06/Rip%20Nav%20Tracker%20Multi%20page%20brochure.pdf", Sep. 2014, pp. 12.

Mereen-Johnson, LLC, "Rip Navigator Scout Rip Optimizing System", "Downloaded from internet page: http://www.mereen-johnson.com//sites/default/files/Rip%20Nav%20Scout%20Multi%20page%20brochure.pdf", Sep. 2014, pp. 1-3.

* cited by examiner

AUTOMATED SYSTEM AND METHOD TO ENHANCE SAFETY AND STRENGTH OF WOOD TRUSS STRUCTURES

CROSS-REFERENCE TO RELATED APPLICATION

This application claims priority benefit, under 35 U.S.C. § 119(e), of U.S. Provisional Patent Application No. 62/388,048, filed Jan. 14, 2016 by Steven Weinschenk, titled "AUTOMATED SYSTEM AND METHOD TO ENHANCE SAFETY AND STRENGTH OF WOOD TRUSS STRUCTURES," which is incorporated herein by reference in its entirety.

FIELD OF THE INVENTION

The present invention relates to a system that includes a computer processor having a plurality of input data devices, a plurality of output data devices, and a plurality of sensors; and a mechanical assembly integrated with the computer processor to reposition a piece of wood lumber based on software code executing in the computer processor, and a method that includes eliciting and receiving into the computer processor data parameters from a first human user; obtaining incoming data points about the lumber from the plurality of sensors; processing and storing the data parameters; comparing the incoming data points to the data parameters to obtain comparison results; and, based on the comparison results, (1) rejecting the lumber to a preprogrammed position, (2) feeding the lumber into a saw assembly as positioned, or (3) repositioning the lumber to a more optimal position prior to feeding the lumber to the saw assembly.

BACKGROUND OF THE INVENTION

The problem with today's technology is that manually loading wood into the infeed systems operator can make the determination how to orient the wood. The crown is curvature of the wood in the widest dimension. Crown should be orientated to optimize with the wood saw equipment. Certain wood trusses are more secure if the crown of the wood is oriented correctly.

Automated systems today are unable to distinguish the crown of the lumber.

SUMMARY OF THE INVENTION

In some embodiments, the present invention provides a system that includes a computer processor, wherein the computer processor includes: a plurality of input data devices, a plurality of output data devices, and a plurality of sensors, and wherein the system further includes a mechanical assembly integrated with the computer processor to reposition a piece of wood lumber based on software code executing in the computer processor.

In some embodiments, the present invention provides a method that operates on a computer processor having a plurality of input data devices, a plurality of output data devices, a plurality of sensors, a database, software code, and a wireless interface, wherein the computer processor is integrated with mechanical components, and wherein the method includes eliciting and receiving into the computer processor data parameters from a first human user; obtaining incoming data points about lumber from the plurality of sensors; processing the data parameters to obtain processed data parameters; storing the processed data parameters; comparing the incoming data points from the plurality of sensors to the stored data parameters to obtain comparison results; and, based on the comparison results, (1) directing the mechanical components to reject the wood to a preprogrammed position, (2) directing the mechanical components to feed the lumber into a saw assembly as positioned, or (3) directing the mechanical components to reposition the lumber to a more optimal position prior to feeding the lumber to a saw assembly.

COPYRIGHT NOTICE/PERMISSION

Figure 1:
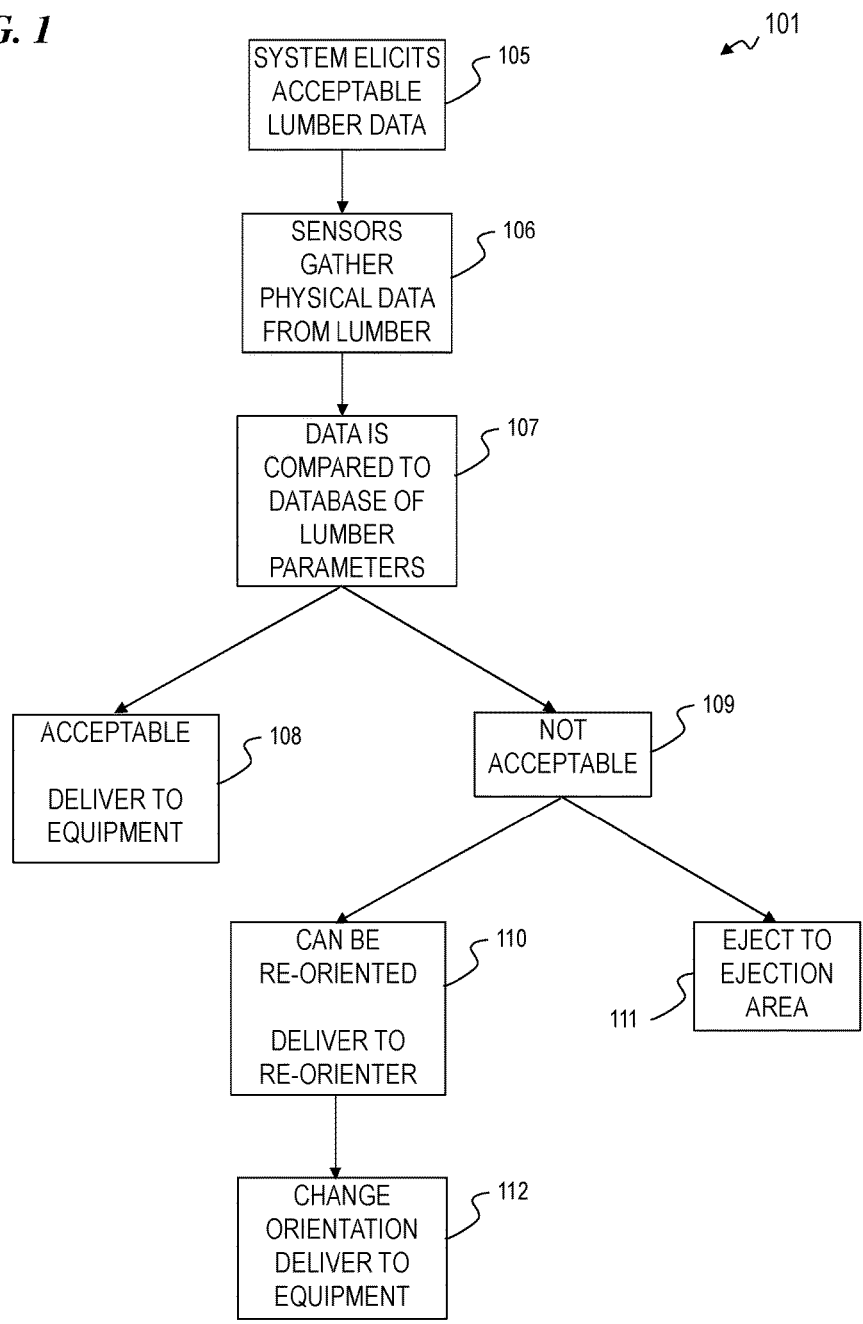
FIG. 1 is a flowchart 101 of one embodiment of the system data processing and software integration of the present invention.

A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice applies to the software and data as described herein and in the drawings hereto in the attached appendices: Copyright © 2014-2017, Steven R. Weinschenk, All Rights Reserved.

DETAILED DESCRIPTION OF THE INVENTION

Although the following detailed description contains many specifics for the purpose of illustration, a person of ordinary skill in the art will appreciate that many variations and alterations to the following details are within the scope of the invention. Specific examples are used to illustrate particular embodiments; however, the invention described in the claims is not intended to be limited to only these examples, but rather includes the full scope of the attached claims. Accordingly, the following preferred embodiments of the invention are set forth without any loss of generality to, and without imposing limitations upon the claimed invention. Further, in the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention.

It is specifically contemplated that the present invention includes embodiments having combinations and subcombinations of the various embodiments and features that are individually described herein (i.e., rather than listing every combinatorial of the elements, this specification includes descriptions of representative embodiments and contemplates embodiments that include some of the features from one embodiment combined with some of the features of another embodiment, including embodiments that include some of the features from one embodiment combined with some of the features of embodiments described in the patents and application publications incorporated by reference in the present application). Further, some embodiments include fewer than all the components described as part of any one of the embodiments described herein.

The leading digit(s) of reference numbers appearing in the Figures generally corresponds to the Figure number in which that component is first introduced, such that the same reference number is used throughout to refer to an identical component which appears in multiple Figures. Signals and connections may be referred to by the same reference number or label, and the actual meaning will be clear from its use in the context of the description.

In some embodiments, the present invention provides a crown-detection system for wood truss lumber infeed saw equipment for enhanced structural support and safety features. In some embodiments, the present invention provides an automated "AutoCurvature System" that detects the crown orientation of the lumber. In some embodiments, after detection by the AutoCurvature System that determines the bow, crown, or twist of a piece of lumber, the AutoCurvature System automatically rejects the wood piece, or the wood piece is reoriented.

In some embodiments, the AutoCurvature System elicits information from the environment or a human operator. In some embodiments, upon receipt of the initial data points, the AutoCurvature System sensors detect the curvature of the lumber piece, and compare the parameters from the detection to an acceptable range of data points pre-programed in the AutoCurvature System (in some such embodiments, the comparison is performed using an algorithm).

In some embodiments, the AutoCurvature System determines: (1) that the lumber should be rejected, (2) that the direction of the lumber needs to be changed, or (3) that the lumber should be fed, as situated/oriented, into the saw.

In some embodiments, the sensors of the present invention include single-point optical systems. In some embodiments, the sensors include multiple-point optical systems. In some embodiments, the sensors include mechanically driving electrical. In some embodiments, the sensors include camera technologies. In some embodiments, the sensors include lasers. In some embodiments, the sensors include motion detection. In some embodiments, the sensors include temperature detection. In some embodiments, the sensors include weight detection. In some embodiments, the sensors include moisture detection.

FIG. 1 is a flowchart 101 of one embodiment of the system data processing and software integration of the present invention. In some embodiments, at box 105, the system (e.g., system 301 of FIG. 3) elicits acceptable lumber data. In some embodiments, at box 106, sensors gather physical data from lumber. In some embodiments, at box 107, the physical data is compared to a database of lumber parameters to obtain a data comparison. In some embodiments, at box 108, the data comparison is acceptable and therefore the lumber is delivered to equipment. In some embodiments, at box 109, the data comparison is unacceptable. In some embodiments, at box 110, the lumber can be re-oriented so the lumber is delivered to a re-orienter. In some embodiments, at box 111, the lumber is ejected to an ejection area. In some embodiments, at box 112, the orientation of the lumber is changed and then the lumber is delivered to equipment.

Figure 2A:
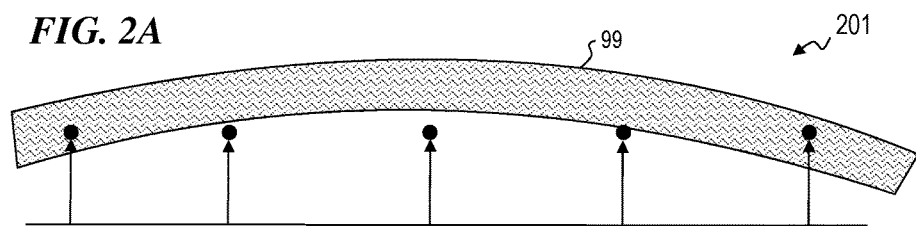
FIG. 2A is a schematic diagram 201 showing data points used to detect crook in a piece of lumber 99, according to some embodiments of the present invention.

FIG. 2A is a schematic diagram 201 showing data points used to detect crook in a piece of lumber 99, according to some embodiments of the present invention.

Figure 2B:
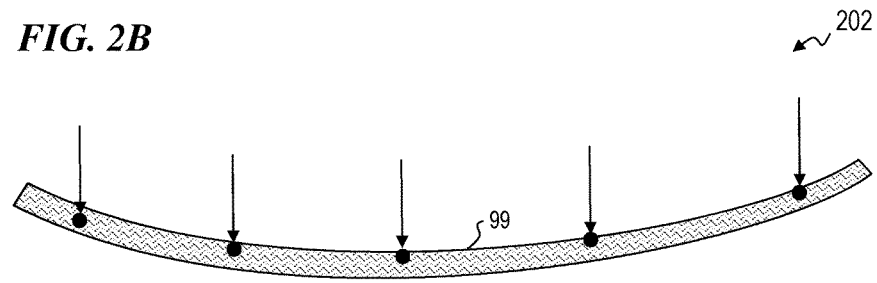
FIG. 2B is a schematic diagram 202 showing data points used to detect bow in a piece of lumber 99, according to some embodiments of the present invention.

FIG. 2B is a schematic diagram 202 showing data points used to detect bow in a piece of lumber 99, according to some embodiments of the present invention.

Figure 2C:
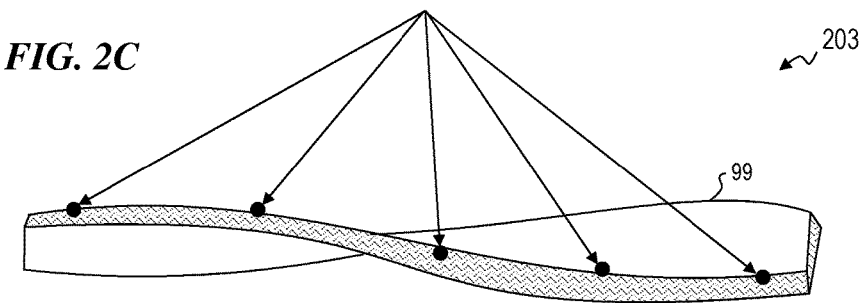
FIG. 2C is a schematic diagram 203 showing data points used to detect twist in a piece of lumber 99, according to some embodiments of the present invention.

FIG. 2C is a schematic diagram 203 showing data points used to detect twist in a piece of lumber 99, according to some embodiments of the present invention.

Figure 2D:
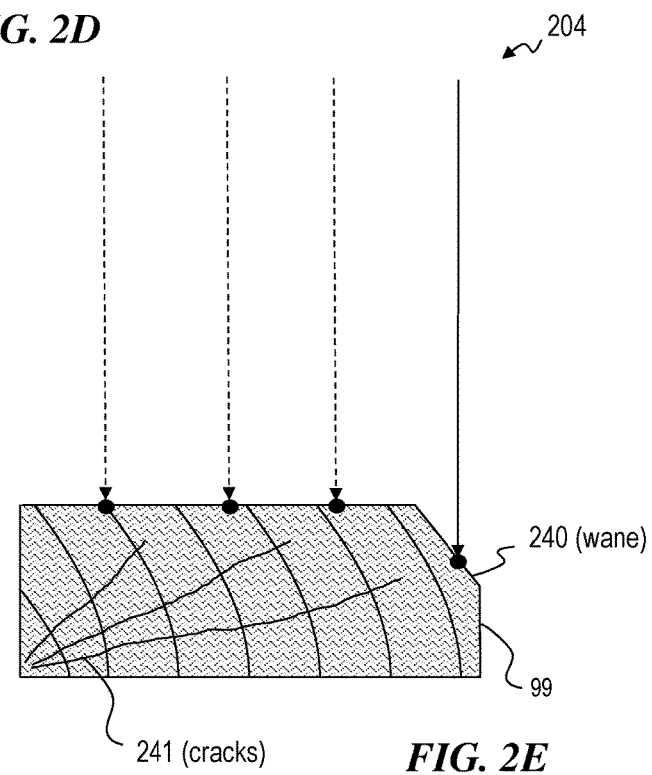
FIG. 2D is a schematic diagram 204 showing data points used to detect cracks 241 and wane 240 in a piece of lumber 99, according to some embodiments of the present invention.

FIG. 2D is a schematic diagram 204 showing data points used to detect cracks 241 and wane 240 in a piece of lumber 99, according to some embodiments of the present invention.

Figure 2E:
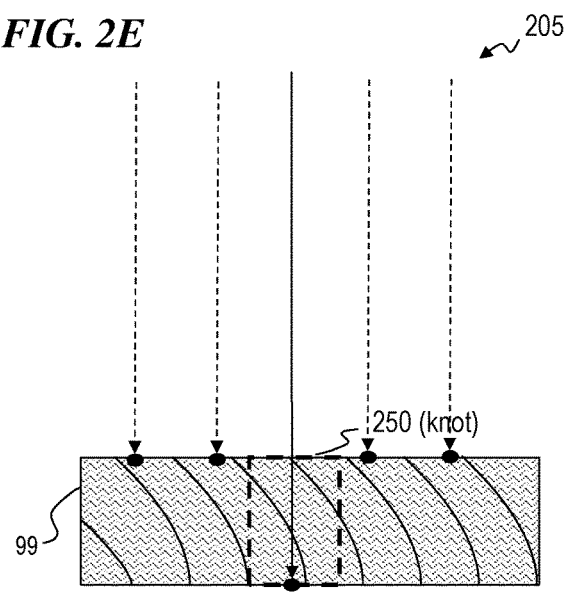
FIG. 2E is a schematic diagram 205 showing data points used to detect a knot 250 in a piece of lumber 99, according to some embodiments of the present invention.

FIG. 2E is a schematic diagram 205 showing data points used to detect a knot 250 in a piece of lumber 99, according to some embodiments of the present invention.

Figure 3:
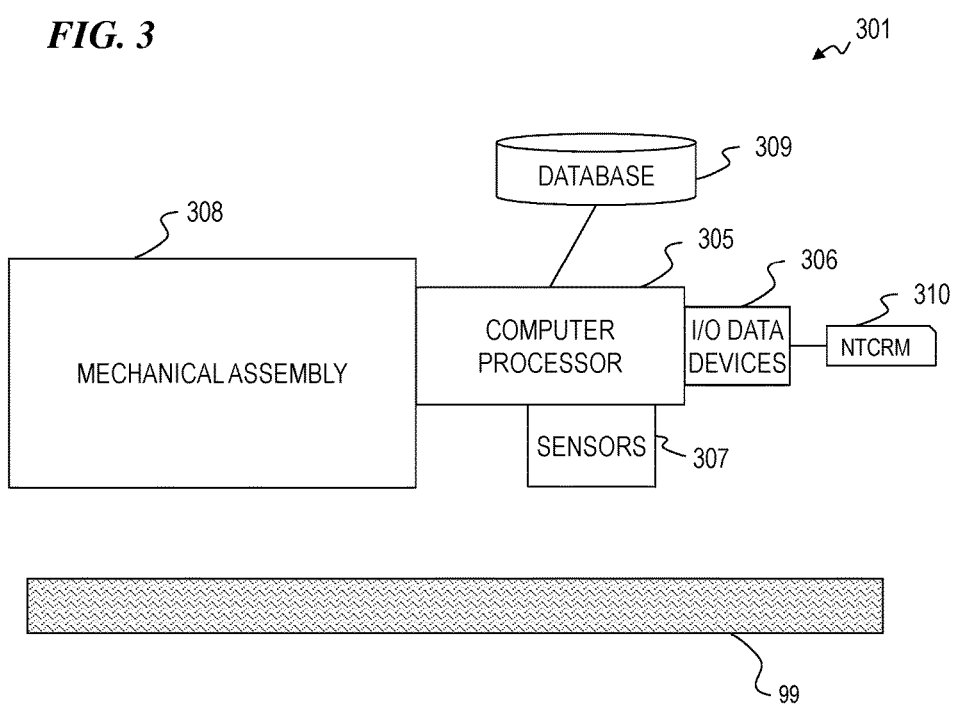
FIG. 3 is a schematic diagram of a lumber-analyzer system 301, according to some embodiments of the present invention.

FIG. 3 is a schematic diagram of a lumber-analyzer system 301, according to some embodiments of the present invention. In some embodiments, system 301 includes a computer processor 305, wherein computer processor 305 includes a plurality of input/output data devices 306 and a plurality of sensors 307. In some embodiments, system 301 further includes a mechanical assembly 308 integrated with computer processor 305 to reposition a piece of wood lumber 99 based on software code executing in computer processor 305. In some embodiments, a database 309 is operatively coupled to computer processor 305. In some embodiments, a non-transitory storage medium 310 (storing thereon instructions for performing the method of the present invention) is connectable to computer processor 305, for example, via one or more of the plurality of input/output data devices 306.

In some embodiments, system 301 uses method 101 to elicit and receive data to detect and measure wane or cracks on the board. In some embodiments, system 301 detects cup. In some embodiments, the system 301 detects crook defects. In some embodiments, system 301 further performs wane detection, split detection, knot detection, and/or bark detection.

In some embodiments, system 301 detects grain quality and ring density.

In some embodiments, system 301 reorients the lumber by physically rotating the lumber piece on its axis to better optimize wood via mechanical action. In some embodiments, reorientation of the lumber uses compressed air. In some embodiments, reorientation of the lumber uses mechanical fasteners.

In some embodiments, human users communicate with system 301 via wireless communications. In some embodiments, human users communicate with system 301 via wireless mobile devices.

It is to be understood that the above description is intended to be illustrative, and not restrictive. Although numerous characteristics and advantages of various embodiments as described herein have been set forth in the foregoing description, together with details of the structure and function of various embodiments, many other embodiments and changes to details will be apparent to those of skill in the art upon reviewing the above description. The scope of the invention should be, therefore, determined with reference to the appended claims, along with the full scope of equivalents to which such claims are entitled. In the appended claims, the terms "including" and "in which" are used as the plain-English equivalents of the respective terms "comprising" and "wherein," respectively. Moreover, the terms "first," "second," and "third," etc., are used merely as labels, and are not intended to impose numerical requirements on their objects.

What is claimed is:

1. A system comprising:
    a computer processor that includes:
        a plurality of input data devices,
        a plurality of output data devices, and
        a plurality of sensors configured to sense a direction of curvature of a piece of wood lumber; and
    a mechanical assembly integrated with the computer processor to reposition the piece of wood lumber to conditionally change the direction of curvature of the piece of wood lumber relative to a wood saw based on the sensed direction of curvature under control of software code executing in the computer processor.

2. The system of claim 1, further comprising a database of lumber parameters operatively coupled to the computer processor, wherein the computer processor uses the database to obtain a data comparison, wherein if the data comparison is acceptable then the wood lumber is delivered to the saw, wherein if the data comparison is unacceptable and the wood lumber is re-orientable then the wood lumber is delivered to a re-orienter that changes the orientation of the lumber and then the wood lumber is delivered to the saw.

3. A method that operates on a computer processor having a plurality of input data devices, a plurality of output data devices, a plurality of sensors, a database, software code, and a wireless interface, wherein the computer processor is integrated with mechanical components including a wood saw, and wherein the method comprises:
    eliciting and receiving into the computer processor data parameters from a first human user;
    obtaining incoming data points about a piece of lumber from the plurality of sensors;
    processing the data parameters to obtain processed data parameters, wherein the processed data parameters include an intended direction of curvature of the piece of lumber relative to the wood saw;
    storing the processed data parameters;
    processing the incoming data points about the piece of lumber to determine a direction of curvature of the piece of lumber;
    comparing the determined direction of curvature of the piece of lumber obtained from the processing of the incoming data points from the plurality of sensors to the intended direction of curvature of the piece of lumber relative to the wood saw in the stored data parameters to obtain comparison results; and
    conditionally directing the mechanical components to reposition the piece of lumber such that the direction of curvature relative to the wood saw matches the intended direction of curvature based on the comparison results.

4. The method of claim 3, further comprising:
    conditionally directing the mechanical components to feed the lumber into a saw assembly of the wood saw as repositioned based on the comparison results.

5. The method of claim 3, further comprising:
    conditionally directing the mechanical components to reposition the lumber to a more optimal position prior to feeding the lumber to a saw assembly of the wood saw based on the comparison results.

6. A non-transitory storage medium having computer-executable instructions stored thereon, wherein the instructions, when executed on a suitable computer processor integrated with mechanical components including a wood saw, and having a plurality of input data devices, a plurality of output data devices, a plurality of sensors, a database, software code, and a wireless interface, perform a method comprising:
    eliciting and receiving into the computer processor data parameters from a first human user;
    obtaining incoming data points about a piece of lumber from the plurality of sensors;
    processing the data parameters to obtain processed data parameters, wherein the processed data parameters include an intended direction of curvature of the piece of lumber relative to the wood saw;
    storing the processed data parameters;
    processing the incoming data points about the piece of lumber to determine a direction of curvature of the piece of lumber;
    comparing the determined direction of curvature of the piece of lumber obtained from the processing of the incoming data points from the plurality of sensors to the intended direction of curvature of the piece of lumber relative to the wood saw in the stored data parameters to obtain comparison results; and
    conditionally directing the mechanical components to reject reposition the piece of lumber such that the direction of curvature relative to the wood saw matches the intended direction of curvature based on the comparison results.

7. The non-transitory storage medium of claim 6, further comprising instructions that cause the method to further include:
    conditionally directing the mechanical components to feed the lumber into a saw assembly of the wood saw as repositioned based on the comparison results.

8. The non-transitory storage medium of claim 6, further comprising instructions that cause the method to further include:
    conditionally directing the mechanical components to reposition the lumber to a more optimal position prior to feeding the lumber to a saw assembly of the wood saw based on the comparison results.

9. The non-transitory storage medium of claim 6, further comprising instructions that cause the method to further include:
    conditionally directing the mechanical components to reject the piece of lumber to a preprogrammed location based on the comparison results.

10. The non-transitory storage medium of claim 6, further comprising instructions that cause the method to further include:
    conditionally directing the mechanical components to reorient the piece of lumber using compressed air.

11. The non-transitory storage medium of claim 6, further comprising instructions that cause the method to further include:
    conditionally directing the mechanical components to reorient the piece of lumber using mechanical fasteners.

12. The system of claim 1, wherein the mechanical assembly uses compressed air to rotate the piece of wood lumber on its axis.

13. The system of claim 1, wherein the mechanical assembly includes mechanical fasteners to rotate the piece of wood lumber on its axis.

14. The system of claim 1, further comprising:
a mechanical assembly integrated with the computer processor to reject the piece of wood lumber to a preprogrammed location.

15. The system of claim 14, further comprising:
one or more sensors configured to sense weight of the piece of lumber.

16. The system of claim 14, further comprising:
one or more sensors configured to sense moisture.

17. The system of claim 1, wherein the plurality of sensors includes multipoint optical sensors.

18. The system of claim 1, wherein the plurality of sensors includes camera technologies.

19. The system of claim 1, wherein the plurality of sensors includes lasers.

20. The method of claim 3, further comprising:
conditionally directing the mechanical components to reject the piece of lumber to a preprogrammed rejected-lumber location based on the comparison results.

\* \* \* \* \*